(12) United States Patent
Hirashima

(10) Patent No.: US 12,191,615 B2
(45) Date of Patent: Jan. 7, 2025

(54) ELECTRICAL APPARATUS AND METHOD OF MANUFACTURING SAME

(71) Applicant: DENSO CORPORATION, Kariya (JP)

(72) Inventor: Shigeo Hirashima, Kariya (JP)

(73) Assignee: DENSO CORPORATION, Kariya (JP)

( * ) Notice: Subject to any disclaimer, the term of this patent is extended or adjusted under 35 U.S.C. 154(b) by 377 days.

(21) Appl. No.: 17/847,552

(22) Filed: Jun. 23, 2022

(65) Prior Publication Data

US 2022/0328984 A1 Oct. 13, 2022

Related U.S. Application Data

(63) Continuation of application No. PCT/JP2020/045367, filed on Dec. 7, 2020.

(30) Foreign Application Priority Data

Dec. 23, 2019 (JP) ................................ 2019-231850

(51) Int. Cl.
*H01R 4/02* (2006.01)
*B23K 26/21* (2014.01)
*H05K 1/18* (2006.01)

(52) U.S. Cl.
CPC ............. *H01R 4/029* (2013.01); *B23K 26/21* (2015.10); *H05K 1/181* (2013.01)

(58) Field of Classification Search
CPC . H01R 4/00; H01R 4/02; H01R 4/021; H01R 4/023; H01R 4/029; B23K 26/20; B23K 26/21; H05K 1/18; H05K 1/181

USPC ........................................................ 439/534
See application file for complete search history.

(56) References Cited

U.S. PATENT DOCUMENTS

2022/0328984 A1\* 10/2022 Hirashima ............. H05K 1/181

FOREIGN PATENT DOCUMENTS

| JP | 2002-103056 A | 4/2002 |
| JP | 2010-69516 A | 4/2010 |
| JP | 2015-193019 A | 11/2015 |

\* cited by examiner

*Primary Examiner* — Khiem M Nguyen
(74) *Attorney, Agent, or Firm* — Oliff PLC

(57) ABSTRACT

An electrical apparatus includes first and second welded members that are welded together. The first welded member has a first metal part and a first resin part covering part of the first metal part. The second welded member has a second metal part and a second resin part covering part of the second metal part. The first metal part has a first standing terminal portion exposed from the first resin part and standing in a standing direction. The second metal part has a second standing terminal portion exposed from the second resin part and standing in the standing direction. The first and second standing terminal portions are welded to each other so that a weld is formed therebetween. The first and second resin parts partially overlap each other in the standing direction. The weld is within a projection region of the first and second resin parts in the standing direction.

8 Claims, 9 Drawing Sheets

ELECTRICAL APPARATUS AND METHOD OF MANUFACTURING SAME

CROSS-REFERENCE TO RELATED APPLICATIONS

The present application is a continuation application of International Application No. PCT/JP2020/045367 filed on Dec. 7, 2020, which is based on and claims priority from Japanese Patent Application No. 2019-231850 filed on Dec. 23, 2019. The entire contents of these applications are incorporated by reference into the present application.

BACKGROUND

1 Technical Field

The present disclosure relates to electrical apparatuses and methods of manufacturing the electrical apparatuses.

2 Description of Related Art

In electrical apparatuses, welded portions may be formed for joining metal parts of wiring members or the like to each other. However, during the welding of the welded portions to each other, welding spatter is scattered. If the scattered welding spatter adheres to other parts in the electrical apparatus, it may cause various problems.

SUMMARY

According to the present disclosure, there is provided an electrical apparatus which includes a first welded member and a second welded member that are welded together. The first welded member has a first metal part and a first resin part that covers part of the first metal part. The second welded member has a second metal part and a second resin part that covers part of the second metal part. The first metal part has a first standing terminal portion exposed from the first resin part and standing in a standing direction. The second metal part has a second standing terminal portion exposed from the second resin part and standing in the same standing direction as the first standing terminal portion. The first standing terminal portion and the second standing terminal portion are welded to each other so that a weld is formed therebetween. The first resin part and the second resin part partially overlap each other in the standing direction. The weld is within a projection region of the first resin part and the second resin part in the standing direction.

According to the present disclosure, there is also provided a method of manufacturing an electrical apparatus. The electrical apparatus includes a first welded member and a second welded member that are welded together. The first welded member has a first metal part and a first resin part that covers part of the first metal part. The second welded member has a second metal part and a second resin part that covers part of the second metal part. The first metal part has a first standing terminal portion exposed from the first resin part and standing in a standing direction. The second metal part has a second standing terminal portion exposed from the second resin part and standing in the same standing direction as the first standing terminal portion. The method includes the steps of: (1) arranging the first welded member and the second welded member so as to have (i) the first resin part and the second resin part partially overlapping each other in the standing direction and (ii) both a welded portion of the first standing terminal portion and a welded portion of the second standing terminal portion located within a projection region of the first resin part and the second resin part in the standing direction; (2) placing a surrounding jig around the first standing terminal portion and the second standing terminal portion so as to surround at least the welded portions of the first and second standing terminal portions from directions perpendicular to the standing direction; and (3) welding the welded portions of the first and second standing terminal portions, which are surrounded by the surrounding jig, to each other to form a weld therebetween.

DESCRIPTION OF EMBODIMENTS

Figure 1:
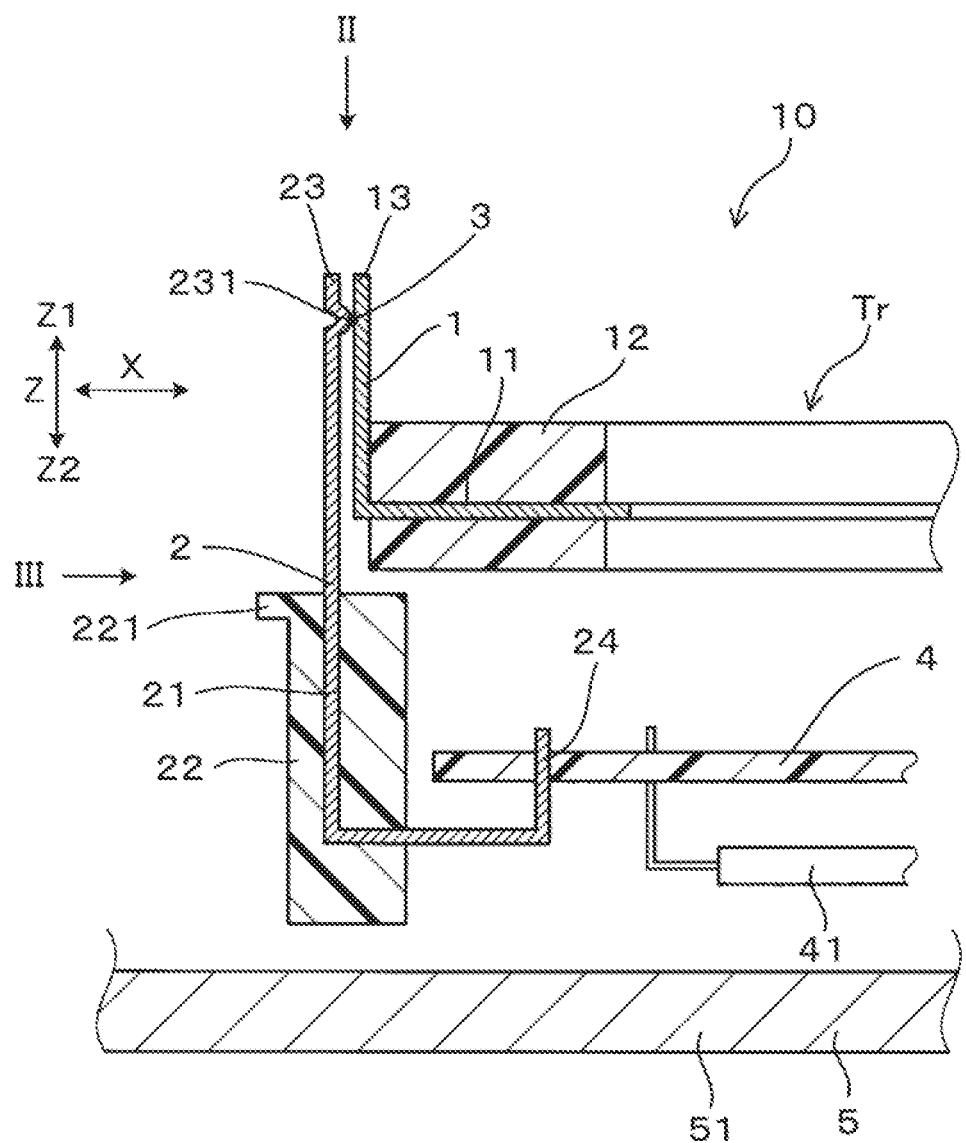
FIG. 1 is a cross-sectional view, taken along the line I-I in FIG. 2, of part of an electrical apparatus according to a first embodiment.

In Japanese Patent Application Publication No. JP 2002-103056 A, there are disclosed shapes of welded portions for preventing scattering of welding spatter.

However, it is practically difficult to apply the shapes of the welded portions disclosed in the above patent document to terminal portions in electrical apparatuses. Therefore, it is desired to develop a technique for suppressing the influence of welding spatter on products during the manufacture of electrical apparatuses.

The present disclosure has been accomplished in view of the above circumstances.

In the above-described electrical apparatus according to the present disclosure, the first resin part and the second resin part partially overlap each other in the standing direction. Moreover, the weld is within the projection region of the first resin part and the second resin part in the standing direction.

With the above configuration, it becomes possible to block the welding spatter from scattering to the opposite side of the first resin part and the second resin part to the weld during the welding of the first standing terminal portion and the second standing terminal portion to each other. Consequently, it becomes possible to limit the scattering region of the welding spatter in the electrical apparatus. As a result, it becomes possible to suppress the influence of the welding spatter on the components of the electrical apparatus.

In the above-described method of manufacturing the electrical apparatus according to the present disclosure, the welded portions of the first and second standing terminal portions are welded, with the surrounding jig placed around the first and second standing terminal portions, to each other to form the weld therebetween.

With the above method, scattering of the welding spatter can be blocked by the surrounding jig as well as by the first resin part and the second resin part. As a result, it becomes possible to more effectively suppress the influence of the welding spatter on the components of the electrical apparatus.

To sum up, according to the present disclosure, it becomes possible to provide the electrical apparatus capable of suppressing the influence of the welding spatter on the components thereof and the method of manufacturing the electrical apparatus.

Exemplary embodiments will be described hereinafter with reference to the drawings. It should be noted that for the sake of clarity and understanding, identical components having identical functions throughout the whole description have been marked, where possible, with the same reference numerals in the drawings and that for the sake of avoiding redundancy, explanation of identical components will not be repeated.

First Embodiment

An electrical apparatus 10 and its manufacturing method according to the first embodiment will be described with reference to FIGS. 1 to 10.

Figure 2:
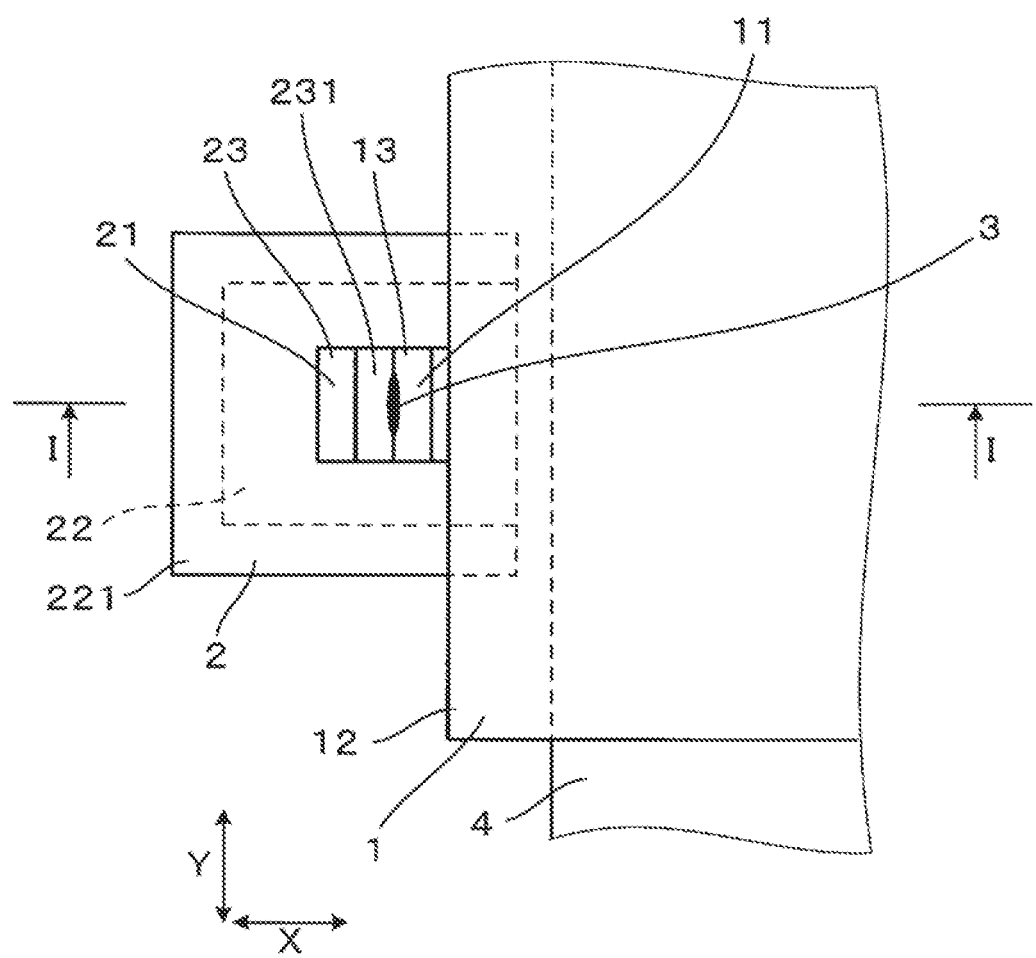
FIG. 2 is a plan view, along the arrow II in FIG. 1, of a weld and its vicinity in the electrical apparatus according to the first embodiment.

As shown in FIGS. 1 and 2, the electrical apparatus 10 according to the present embodiment includes a first welded member 1 and a second welded member 2 that are welded together. The first welded member 1 has a first metal part 11 and a first resin part 12. The first resin part 12 covers part of the first metal part 11. The second welded member 2 has a second metal part 21 and a second resin part 22. The second resin part 22 covers part of the second metal part 21.

The first metal part 11 has a first standing terminal portion 13 exposed from the first resin part 12 and standing (or extending) in a standing direction Z1. Similarly, the second metal part 21 has a second standing terminal portion 23 exposed from the second resin part 22 and standing in the same standing direction Z1 as the first standing terminal portion 13.

In the electrical apparatus 10, there is formed a weld 3 at which the first standing terminal portion 13 and the second standing terminal portion 23 are welded to each other. Moreover, as shown in FIG. 2, the first resin part 12 and the second resin part 22 are arranged so that they partially overlap each other when viewed in the standing direction Z1. Furthermore, the weld 3 is within a projection region of the first resin part 12 and the second resin part 22 in the standing direction Z1 (i.e., within a region on which the first resin part 12 and the second resin part 22 are projected in the standing direction Z1). More particularly, in the present embodiment, the weld 3 is within a projection region of the second resin part 22 in the standing direction Z1 (i.e., within a region on which the second resin part 22 is projected in the standing direction Z1).

Hereinafter, the standing direction Z1 of both the first standing terminal portion 13 and the second standing terminal portion 23 will also be simply referred to as the Z1 direction. Moreover, when it is unnecessary to particularly specify the orientation, directions parallel to the Z1 direction will also be simply referred to as the Z direction.

Figure 3:
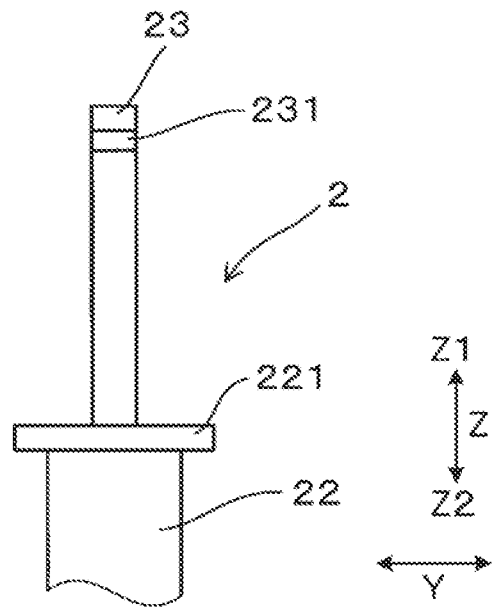
FIG. 3 is a front view, along the arrow III in FIG. 1, of a second welded member in the electrical apparatus according to the first embodiment.

As shown in FIGS. 1 to 3, at least one of the first resin part 12 and the second resin part 22 has a brim portion projecting perpendicularly to the Z direction. More particularly, in the present embodiment, the second resin part 22 has a brim portion 221. The brim portion 221 is formed at an end of the second resin part 22 facing in the Z1 direction. That is, an end surface of the brim portion 221 facing in the Z1 direction is flush with an end surface of the second resin part 22 facing in the Z1 direction.

Moreover, the brim portion 221 is formed so that when viewed in the standing direction Z1, it projects to at least three sides including an opposite side to an adjoining side in an adjoining direction X and both sides in a Y direction perpendicular to the adjoining direction X. Here, the adjoining side denotes a side where the first and second resin parts 12 and 22 adjoin each other; and the adjoining direction X denotes a direction in which the first and second resin parts 12 and 22 adjoin each other. Further, hereinafter, the adjoining direction X, which is perpendicular to the Z direction, will also be simply referred to as the X direction. In addition, the Y direction is perpendicular to both the X direction and the Z direction.

More particularly, in the present embodiment, the brim portion 221 of the second resin part 22 also projects to the adjoining side where the first and second resin parts 12 and 22 adjoin each other. That is, the brim portion 221 projects to both sides in the X direction as well as to both sides in the Y direction.

Figure 4:
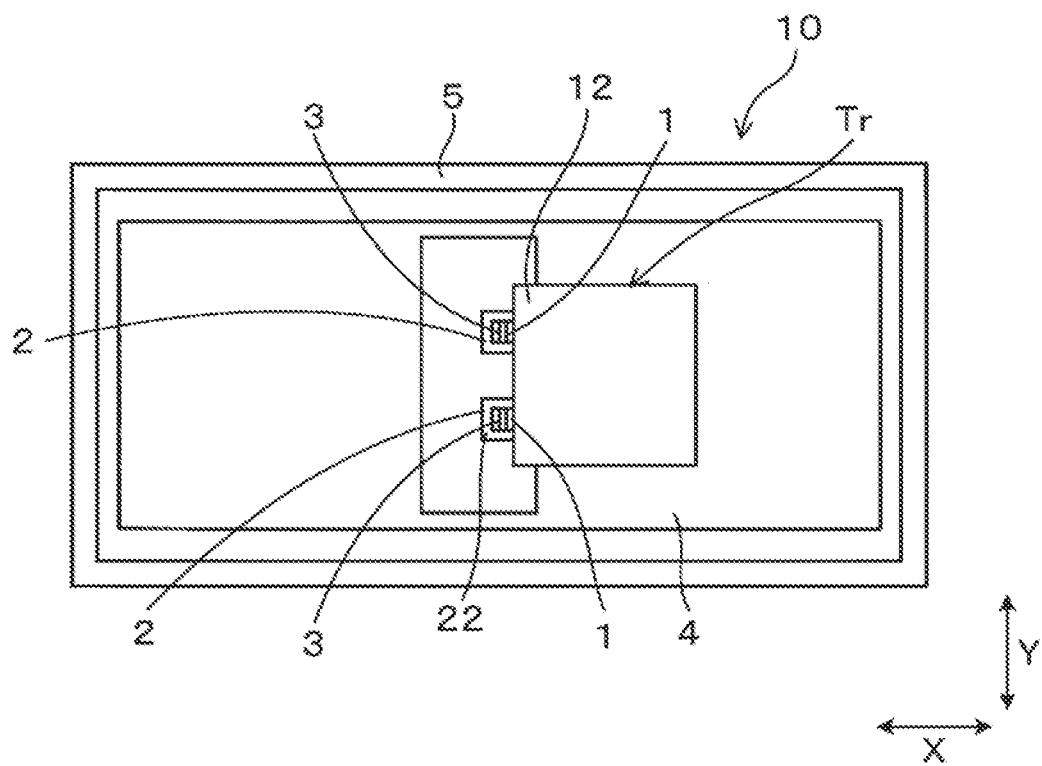
FIG. 4 is a plan view of the electrical apparatus according to the first embodiment.

In the present embodiment, the electrical apparatus 10 is configured as a DC-to-DC converter. As shown in FIG. 4, the electrical apparatus 10 includes a transformer Tr. Moreover, the electrical apparatus 10 also includes an electronic circuit unit which includes a switching circuit, a rectifier circuit, a filter circuit and the like. Further, the electrical apparatus 10 includes an electronic circuit board 4 as a part of the electronic circuit unit. As shown in FIG. 1, on the electronic circuit board 4, there are mounted various electronic components such as a semiconductor module 41. Each of the electronic components also constitutes a part of the electronic circuit unit. Furthermore, the electrical apparatus 10 also includes a case 5 in which are received the components of the electrical apparatus 10, such as the transformer Tr, the electronic circuit board 4 and the various electronic components mounted on the electronic circuit board 4. In addition, the case 5 may be made of, for example, a metal such as an aluminum alloy.

In the present embodiment, the first welded member 1 is constituted of part of the transformer Tr. Specifically, the first metal part 11 of the first welded member 1 is constituted of a primary coil of the transformer Tr and a terminal of the primary coil. The first resin part 12 of the first welded member 1 is constituted of at least part of a bobbin that covers part of the primary coil of the transformer Tr. The first metal part 11 has a portion thereof extending in the X direction and embedded in the first resin part 12. The first metal part 11 also has a portion thereof exposed from the first resin part 12 on one side of the first resin part 12 in the X direction; the exposed portion is bent in the Z1 direction to form the first standing terminal portion 13.

On the other hand, the second welded member 2 is a member which electrically connects the terminal of the primary coil of the transformer Tr (i.e., the first standing terminal portion 13) with the electronic circuit board 4. The second metal part 21 of the second welded member 2 has a first end portion constituting the second standing terminal portion 23 and a second end portion constituting a board connection terminal portion 24 that is connected to the electronic circuit board 4. Moreover, an intermediate portion of the second metal part 21 between the second standing terminal portion 23 and the board connection terminal portion 24 is embedded (or inserted) in the second resin part 22. More specifically, the first end portion of the second metal part 21 protrudes from the second resin part 22 in the Z1 direction, forming the second standing terminal portion 23. Moreover, the second metal part 21 has a protruding portion that protrudes from the second resin part 22 to one side in the X direction, and the second end portion standing in the Z1 direction from a distal end of the protruding portion. The second end portion of the second metal part 21 is connected to the electronic circuit board 4, forming the board connection terminal portion 24. In addition, the board connection terminal portion 24 is inserted into a through-hole formed in the electronic circuit board 4, and joined to the electronic circuit board 4 by soldering or the like.

The second standing terminal portion 23 has a bent convex portion 231 that is bent so as to protrude toward the first standing terminal portion 13 in the X direction. The bent convex portion 231 is placed in contact with and welded to the first standing terminal portion 13.

The semiconductor module 41 has built therein semiconductor elements such as an IGBT (Insulated Gate Bipolar Transistor) and a MOSFET (Metal-Oxide-Semiconductor Field-Effect Transistor). Although not shown in the figures, the various electronic components mounted on the electronic circuit board 4 may further include, for example, a capacitor, a choke coil, a diode and the like. These electronic components are electrically connected with the electronic circuit board 4.

In the electrical apparatus 10, the electronic circuit unit is arranged on the opposite side to the weld 3 with at least one of the first and second resin parts 12 and 22 interposed therebetween. More particularly, in the present embodiment, the electronic circuit board 4 is located on the opposite side to the weld 3 with at least one of the first and second resin parts 12 and 22 interposed therebetween.

The case 5 has an opening at a distal end thereof in the Z1 direction. The opening is closed by a cover (not shown in the figures). Moreover, the case 5 has a bottom wall 51 at a distal end thereof in a Z2 direction that is opposite to the Z1 direction. The electronic circuit board 4 is arranged closer to the bottom wall 51 than the first resin part 12 is. In addition, the electronic circuit board 4 has a pair of major surfaces facing respectively in the Z1 and Z2 directions.

As shown in FIG. 4, in the present embodiment, the primary coil of the transformer Tr has two terminals each of which constitutes one first welded member 1. That is, the electrical apparatus 10 according to the present embodiment includes two first welded members 1 and two second welded members 2. Each of the first welded members 1 is welded to a corresponding one of the second welded members 2, forming a weld 3 therebetween. That is, in the electrical apparatus 10 according to the present embodiment, there are formed two welds 3. In addition, the two first welded members 1 may be configured to share a common first resin part 12. Similarly, the two second welded members 2 may be configured to share a common second resin part 22.

Next, a method of manufacturing the electrical apparatus 10 according to the present embodiment will be described.

Figure 5:
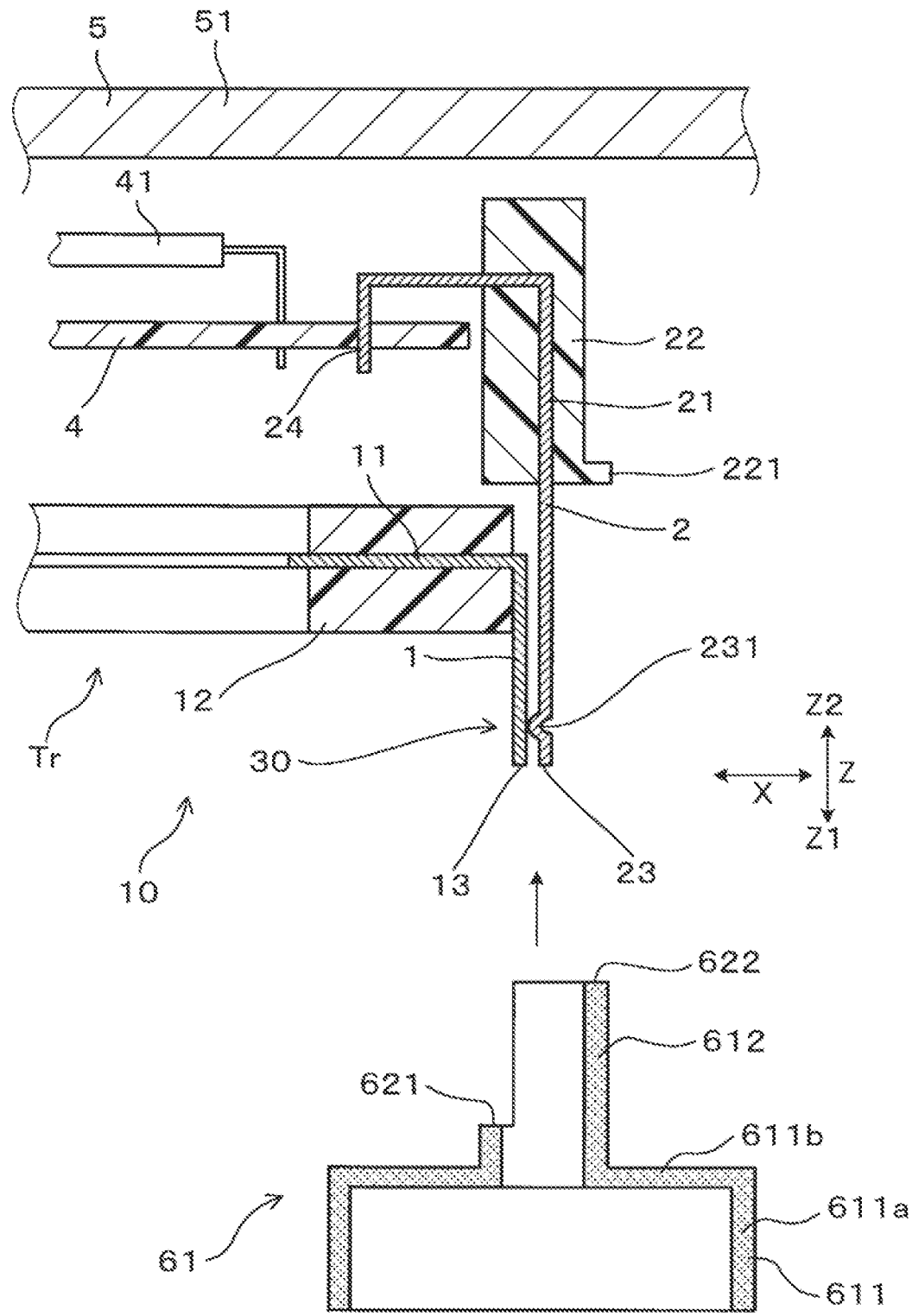
FIG. 5 is an explanatory diagram illustrating a method of manufacturing the electrical apparatus according to the first embodiment, wherein a surrounding jig has not been placed around first and second standing terminal portions to be welded together.

In manufacturing the electrical apparatus 10, as shown in FIG. 5, each pair of the first and second welded members 1 and 2 are arranged so as to have (i) the first resin part 12 of the first welded member 1 and the second resin part 22 of the second welded member 2 partially overlapping each other in the Z direction and (ii) both a welded portion 30 of the first standing terminal portion 13 of the first welded member 1 and a welded portion 30 of the second standing terminal portion 23 of the second welded member 2 located within the projection region of the first resin part 12 and the second resin part 22 in the standing direction Z.

Figure 6:
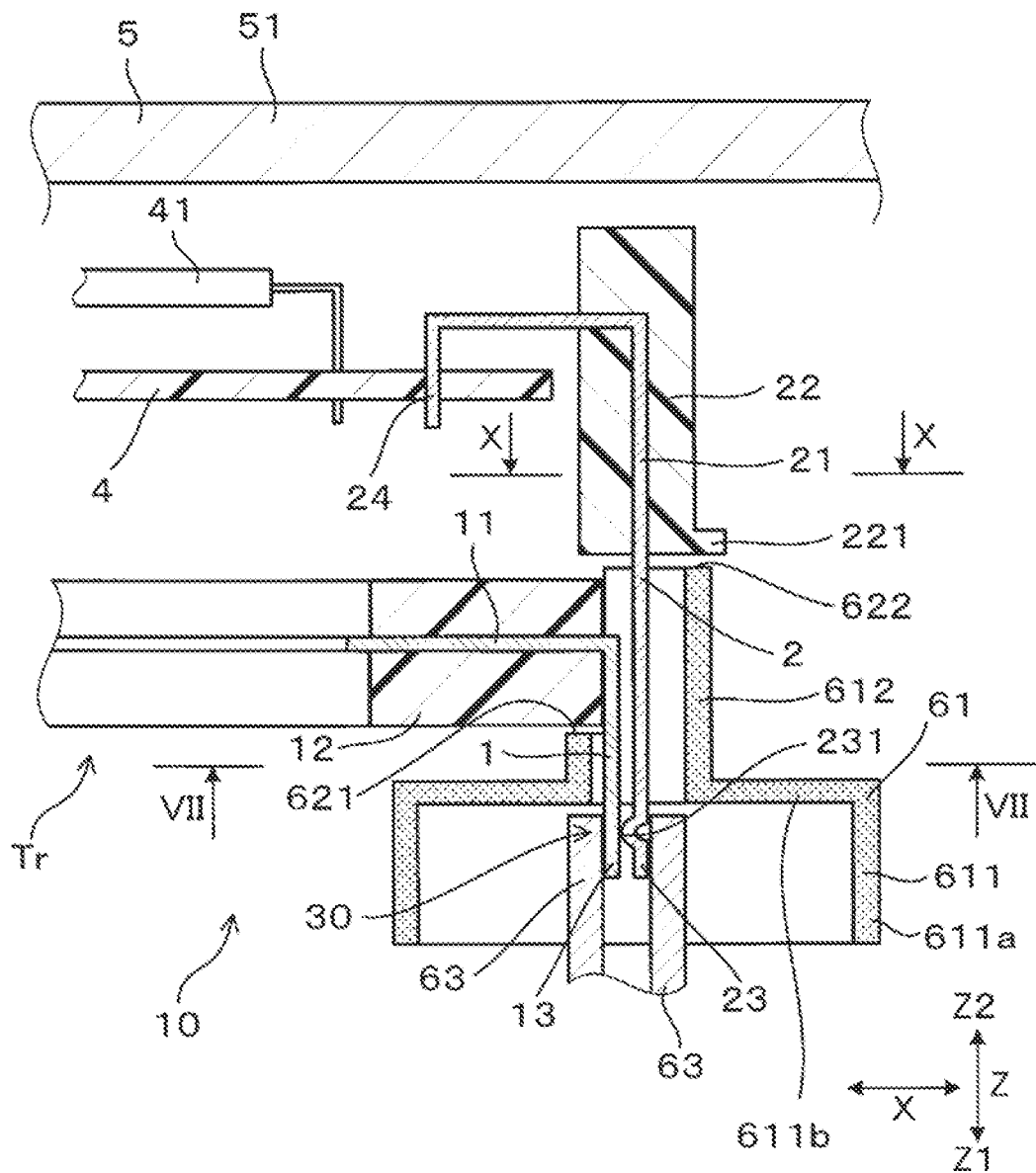
FIG. 6 is an explanatory diagram illustrating the welding of the first and second standing terminal portions in the electrical apparatus according to the first embodiment.
Figure 7:
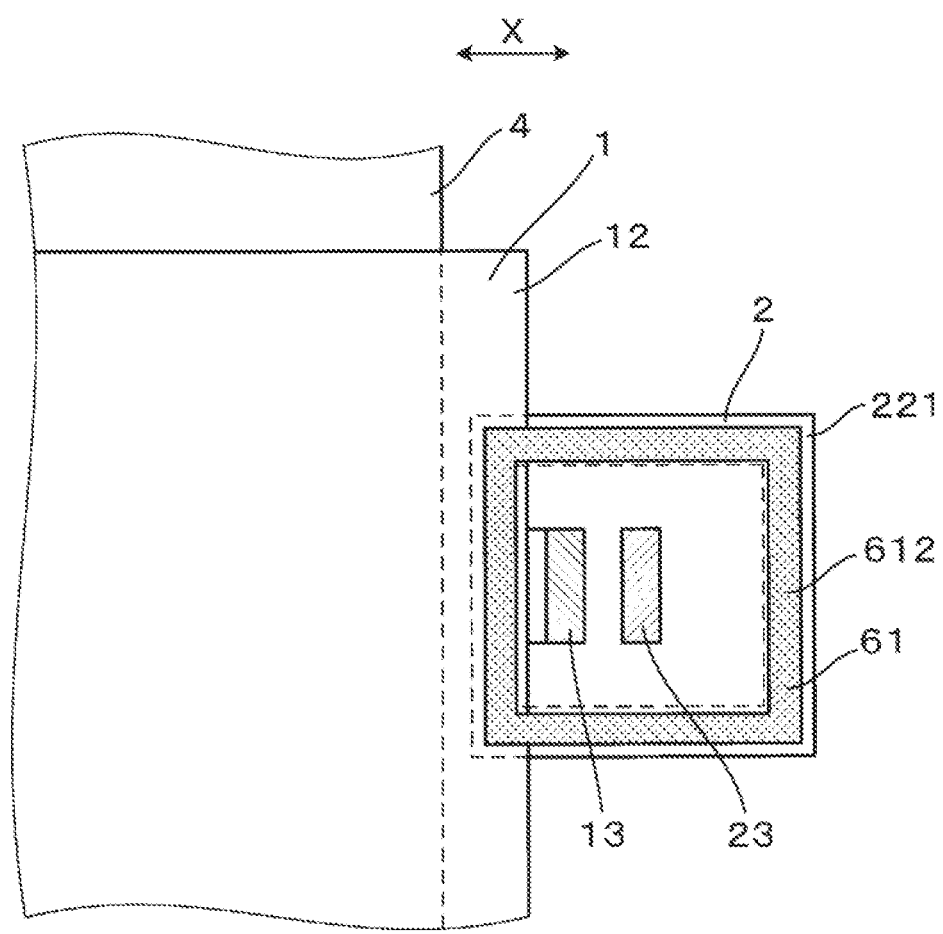
FIG. 7 is a cross-sectional view taken along the line VII-VII in FIG. 6.
Figure 8:
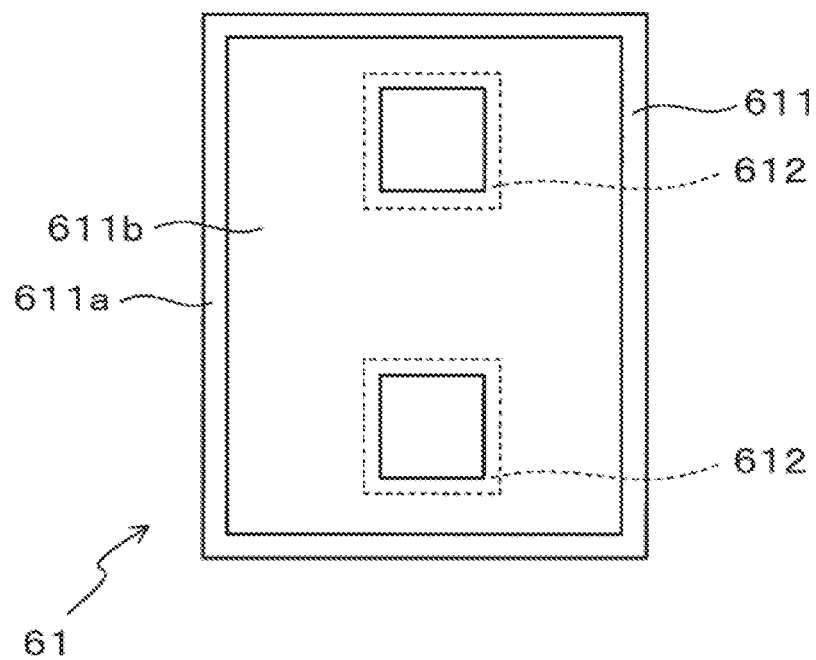
FIG. 8 is a plan view of the surrounding jig used for manufacturing the electrical apparatus according to the first embodiment.

Then, as shown in FIGS. 6 and 7, a surrounding jig 61 is placed around the first and second standing terminal portions 13 and 23 of each pair of the first and second welded members 1 and 2 so as to surround at least the welded portions 30 of the first and second standing terminal portions 13 and 23 from directions perpendicular to the standing direction Z1. More particularly, in the present embodiment, the surrounding jig 61 also surrounds, in addition to the welded portions 30, at least part of each of the first and second standing terminal portions 13 and 23 on the Z2 side of the welded portions 30.

Thereafter, the welded portions 30 of the first and second standing terminal portions 13 and 23 are welded to each other to form the weld 3 therebetween.

In the present embodiment, as shown in FIG. 5, in welding each pair of the first and second welded members 1 and 2, the opening of the case 5 is oriented vertically downward after assembling the components of the electrical apparatus 10 into the case 5. That is, the standing direction Z1 of the first and second standing terminal portions 13 and 23 of each pair of the first and second welded members 1 and 2 coincides with the vertically downward direction. In this state, as shown in FIG. 6, the surrounding jig 61 is placed, from the lower side of the first and second standing terminal portions 13 and 23, to surround at least the welded portions 30 of the first and second standing terminal portions 13 and 23.

As shown in FIGS. 5 to 8, the surrounding jig 61 has a first surrounding portion 611 and a pair of second surrounding portions 612. The first surrounding portion 611 surrounds all the welded portions 30 of the first and second standing terminal portions 13 and 23 of both the pairs of the first and second welded members 1 and 2. On the other hand, each of the second surrounding portions 612 surrounds Z2-side parts of the first and second standing terminal portions 13 and 23 of a corresponding one of the two pairs of the first and second welded members 1 and 2; the Z2-side parts are located on the Z2 side (i.e., the upper side in FIG. 5) of the welded portions 30.

Specifically, in the present embodiment, the first surrounding portion 611 has a circumferential wall 611a and an intermediate wall 611b. The circumferential wall 611a circumferentially surrounds all the welded portions 30 of the first and second standing terminal portions 13 and 23 of both the pairs of the first and second welded members 1 and 2 from directions perpendicular to the Z direction. The intermediate wall 611b is connected with an end of the circumferential wall 611a on the Z2 side. Moreover, the intermediate wall 611b has a pair of openings formed respectively at two different locations. Each of the second surrounding portions 612 is formed in a substantially tubular shape so as to protrude to the Z2 side from a corresponding one of the openings of the intermediate wall 611b.

Figure 9:
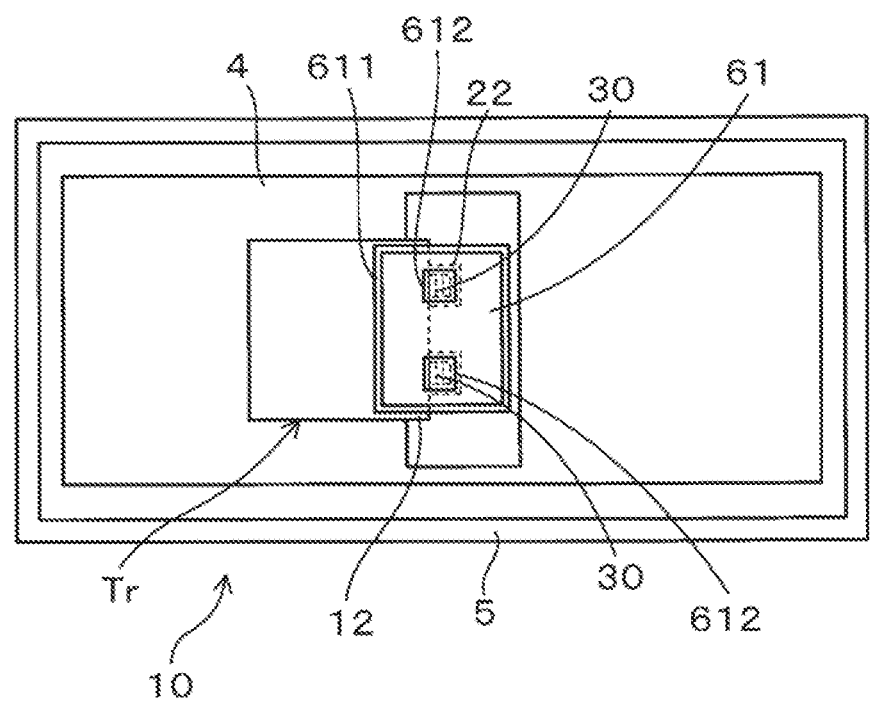
FIG. 9 is a plan view showing the surrounding jig in a state of having been placed around the first and second standing terminal portions in the electrical apparatus according to the first embodiment.

As shown in FIG. 9, when viewed in the Z direction, the two second surrounding portions 612 of the surrounding jig 61 respectively surround the welded portions 30 of the first and second standing terminal portions 13 and 23 of the two pairs of the first and second welded members 1 and 2 in the electrical apparatus 10. In other words, the two second surrounding portions 612 are formed to respectively correspond to the first and second standing terminal portions 13 and 23 of the two pairs of the first and second welded members 1 and 2.

Moreover, as shown in FIGS. 5 and 6, the surrounding jig 61 has, for each pair of the first and second welded members 1 and 2, a first facing portion 621 arranged to face the first resin part 12 of the first welded member 1 in the standing direction Z1 and a second facing portion 622 arranged to face the second resin part 22 of the second welded member 2 in the standing direction Z1. The first facing portion 621 and the second facing portion 622 are different in position in the standing direction Z1.

Specifically, the second facing portion 622 is formed to be located on the Z2 side of the first facing portion 621. This positional relationship between the first and second facing portions 621 and 622 corresponds to the positional relationship between the first and second resin parts 12 and 22 which the first and second facing portions 621 and 622 respectively face. Consequently, it becomes possible to place the first facing portion 621 of the surrounding jig 61 close to and facing the first resin part 12 of the first welded member 1 while placing the second facing portion 622 of the surrounding jig 61 close to and facing the second resin part 22 of the second welded member 2. In addition, the first facing portion 621 of the surrounding jig 61 may alternatively be placed in contact with the first resin part 12 of the first welded member 1; and the second facing portion 622 of the surrounding jig 61 may alternatively be placed in contact with the second resin part 22 of the second welded member 2.

Figure 10:
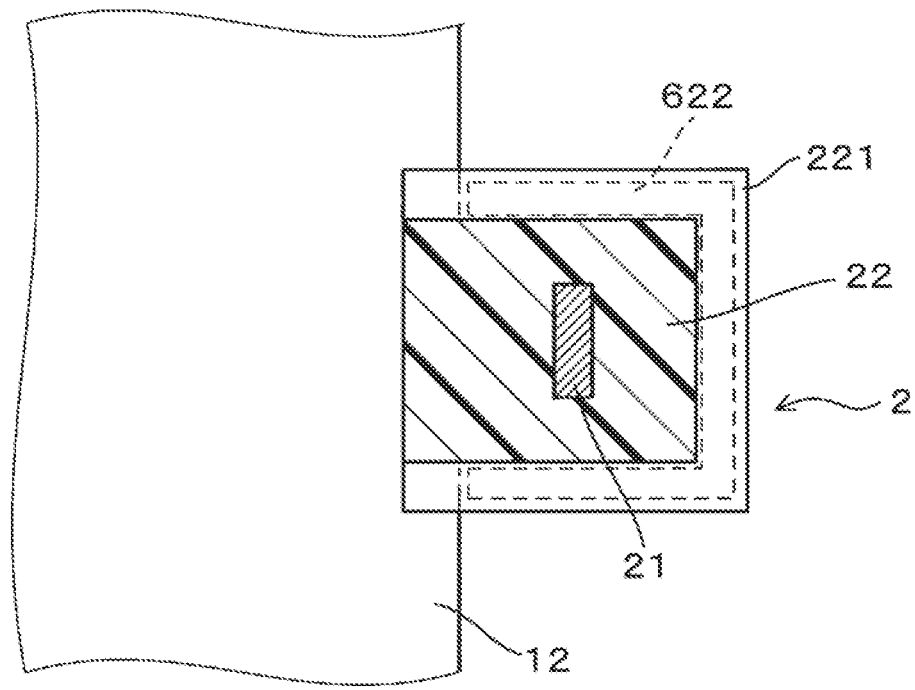
FIG. 10 is a cross-sectional view taken along the line X-X in FIG. 6.

As shown in FIG. 6, the surrounding jig 61 is placed so as to have, for each pair of the first and second welded members 1 and 2, at least part of an opening edge thereof facing the brim portion 221 of the second resin part 22 of the second welded member 2 in the standing direction Z1. More particularly, in the present embodiment, as shown in FIG. 10, the surrounding jig 61 is placed so as to have the second facing portion 622 facing, in the standing direction Z1, the brim portion 221 that projects in three directions perpendicular to the standing direction Z1.

With the surrounding jig 61 placed as described above, for each pair of the first and second welded members 1 and 2, the welded portions 30 of the first and second standing terminal portions 13 and 23 are resistance-welded to each other. In resistance-welding the welded portions 30, they are sandwiched between a pair of electrode members 63. More specifically, as shown in FIG. 6, the welded portions 30 of the first and second standing terminal portions 13 and 23 are sandwiched from both sides in the X direction by the pair of electrode members 63 which are placed inside the first surrounding portion 611 of the surrounding jig 61.

Then, electric current is applied between the pair of electrode members 63 to flow through the welded portions 30 of the first and second standing terminal portions 13 and 23. Consequently, the welded portions 30 of the first and second standing terminal portions 13 and 23 are melted together by the Joule heat generated therein, thus being joined to each other. At this time, the welding spatter is blocked by the first resin part 12 and the second resin part 22 from intruding to the Z2 side thereof. Moreover, the welding spatter is also blocked by the surrounding jig 61 from scattering to the surroundings of the welded portions 30.

The electrode members 63 and the surrounding jig 61 may be formed integrally with each other. In other words, the electrode members 63 and the surrounding jig 61 may be together integrated into a welding apparatus. For example, the surrounding jig 61 may be mounted to a welding apparatus that includes the electrode members 63. Alternatively, the electrode members 63 and the surrounding jig 61 may be formed separately from each other. In other words, the surrounding jig 61 may be formed independently of a welding apparatus that includes the electrode members 63. In this case, the surrounding jig 61 may be first placed around the welded portions 30 of the first and second standing terminal portions 13 and 23; then the electrode members 63 of the welding apparatus may be placed inside the first surrounding portion 611 of the surrounding jig 61 to sandwich the welded portions 30 therebetween.

In the present embodiment, the surrounding jig 61 is configured to have one first surrounding portion 611 and two second surrounding portions 612 as described above. As an alternative, the surrounding jig 61 may be configured to have one first surrounding portion 611 and one second surrounding portion 612. As another alternative, the surrounding jig 61 as a whole may be formed in a substantially tubular shape such that there are no particular boundaries between the first surrounding portion 611 and the second surrounding portions 612.

Next, operational effects of the present embodiment will be described.

In the electrical apparatus 10 according to the present embodiment, for each pair of the first and second welded members 1 and 2, the first resin part 12 and the second resin part 22 are arranged so that when viewed in the Z direction, they partially overlap each other. Moreover, the weld 3 formed between the first standing terminal portion 13 and the second standing terminal portion 23 is located within the projection region of the first resin part 12 and the second resin part 22 in the Z direction.

With the above configuration, it becomes possible to block the welding spatter from scattering to the opposite side of the first resin part 12 and the second resin part 22 to the weld 3 during the welding of the first standing terminal portion 13 and the second standing terminal portion 23 to each other. Consequently, it becomes possible to limit the scattering region of the welding spatter in the electrical apparatus 10. As a result, it becomes possible to suppress the influence of the welding spatter on the components of the electrical apparatus 10.

Moreover, in the method of manufacturing the electrical apparatus 10 according to the present embodiment, for each pair of the first and second welded members 1 and 2, the welded portions 30 of the first and second standing terminal portions 13 and 23 are welded, with the surrounding jig 61 placed around the first and second standing terminal portions 13 and 23, to each other to form the weld 3 therebetween.

With the above method, scattering of the welding spatter can be blocked by the surrounding jig 61 as well as by the first resin part 12 and the second resin part 22. As a result, it becomes possible to more effectively suppress the influence of the welding spatter on the components of the electrical apparatus 10.

In the electrical apparatus 10, at least one of the first resin part 12 and the second resin part 22 (more particularly, the second resin part 22 in the present embodiment) has the brim portion 221 projecting perpendicularly to the Z direction.

With the brim portion 221, it becomes possible to more effectively block the welding spatter from scattering to the opposite side of the first resin part 12 and the second resin part 22 to the weld 3 during the welding.

Moreover, in the method of manufacturing the electrical apparatus 10 according to the present embodiment, the surrounding jig 61 is placed so as to have at least part of the opening edge thereof facing the brim portion 221 in the standing direction Z1.

With the above placement of the surrounding jig 61, it becomes possible to more effectively block scattering of the welding spatter in the electrical apparatus 10.

Furthermore, in the electrical apparatus 10 according to the present embodiment, the brim portion 221 is formed so that when viewed in the standing direction Z1, it projects to at least three sides including the opposite side to the adjoining side in the adjoining direction X and both sides in the Y direction.

With the above configuration, it becomes possible to block, in a wider range, scattering of the welding spatter in the electrical apparatus 10. In addition, with the surrounding jig 61 placed to face such a brim portion 221 as described above, it becomes possible to more effectively block scattering of the welding spatter in the electrical apparatus 10.

In the electrical apparatus 10 according to the present embodiment, the electronic circuit unit is arranged on the opposite side to the weld 3 with at least one of the first and second resin parts 12 and 22 interposed therebetween; the electronic circuit unit includes the electronic circuit board 4, the semiconductor module 41 and the like.

With the above arrangement, it becomes possible to block the welding spatter from scattering to the electronic circuit unit. As a result, it becomes possible to suppress the influence of the welding spatter on the electronic circuit unit.

In the present embodiment, the surrounding jig 61 is configured to have both the first facing portion 621 arranged to face the first resin part 12 in the Z direction and the second facing portion 622 arranged to face the second resin part 22 in the Z direction. The first facing portion 621 and the second facing portion 622 are different in position in the Z direction.

With the above configuration, the surrounding jig 61 can be placed close to and facing both the first resin part 12 and the second resin part 22 that are located at different positions in the Z direction. As a result, it becomes possible to more effectively block scattering of the welding spatter in the electrical apparatus 10.

To sum up, according to the present embodiment, it becomes possible to provide the electrical apparatus 10 capable of suppressing the influence of the welding spatter on the components thereof and the method of manufacturing the electrical apparatus 10.

Second Embodiment

An electrical apparatus 10 according to the second embodiment has a similar configuration to the electrical apparatus 10 according to the first embodiment. Therefore, mainly the differences therebetween will be described hereinafter.

In the electrical apparatus 10 according to the first embodiment, in each pair of the first and second welded members 1 and 2, only the second resin part 22 of the second welded member 2 has the brim portion 221 formed therein. That is, the first resin part 12 of the first welded member 1 has no brim portion formed therein (see FIG. 1).

Figure 11:
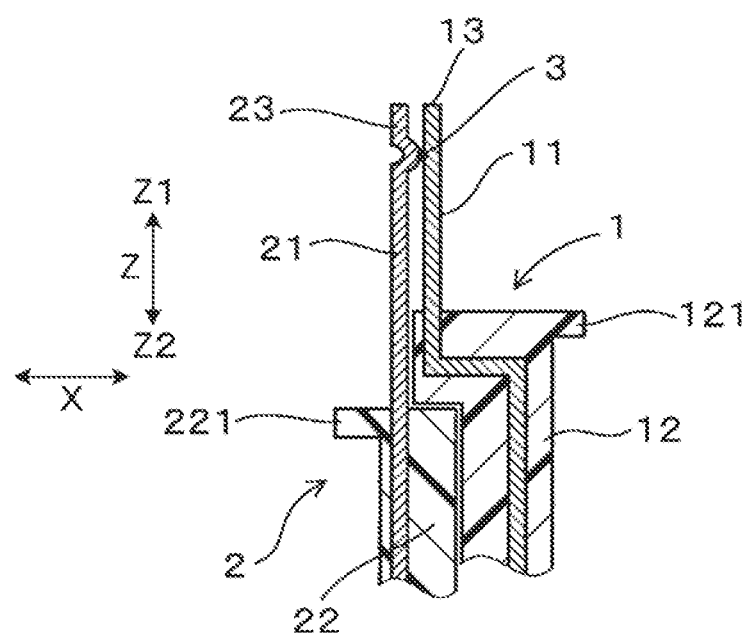
FIG. 11 is a cross-sectional view of part of an electrical apparatus according to a second embodiment.

In contrast, in the electrical apparatus 10 according to the second embodiment, as shown in FIG. 11, in each pair of the first and second welded members 1 and 2, the first resin part 12 of the first welded member 1 and the second resin part 22 of the second welded member 2 respectively have brim portions 121 and 221 formed therein.

Moreover, in the present embodiment, in each pair of the first and second welded members 1 and 2, the first metal part 11 of the first welded member 1 has a protruding portion that protrudes out of the first resin part 12 in the Z1 direction. The protruding portion of the first metal part 11 constitutes the first standing terminal portion 13 that stands in the Z1 direction (i.e., the standing direction). In addition, the first metal part 11 is bent in the first resin part 12.

According to the present embodiment, it is also possible to achieve the same operational effects as described in the first embodiment.

Moreover, according to the present embodiment, with both the brim portions 121 and 221 of the first and second resin parts 12 and 22, it becomes possible to more effectively block the welding spatter from scattering to the opposite side of the first and second resin parts 12 and 22 to the weld 3 during the welding.

Third Embodiment

An electrical apparatus 10 according to the third embodiment has a similar configuration to the electrical apparatus 10 according to the first embodiment. Therefore, mainly the differences therebetween will be described hereinafter.

In the electrical apparatus 10 according to the first embodiment, in each pair of the first and second welded members 1 and 2, the second resin part 22 of the second welded member 2 has a flat end surface facing in the Z1 direction (see FIG. 1).

Figure 12:
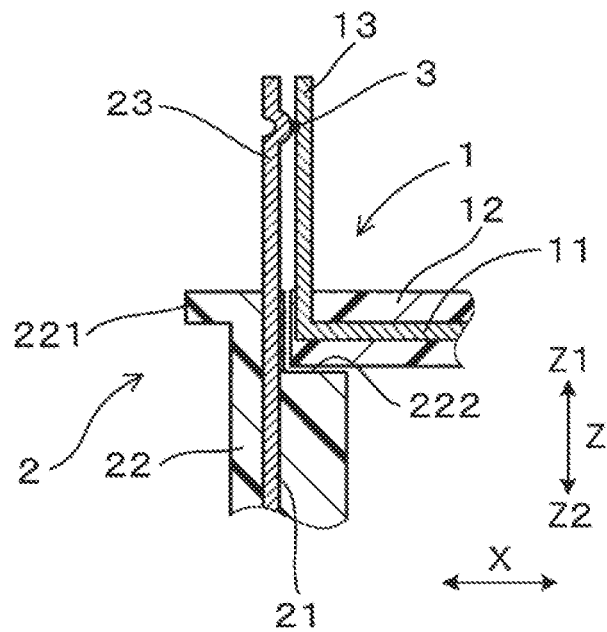
FIG. 12 is a cross-sectional view of part of an electrical apparatus according to a third embodiment.

In contrast, in the electrical apparatus 10 according to the third embodiment, as shown in FIG. 12, in each pair of the first and second welded members 1 and 2, the second resin part 22 of the second welded member 2 has a cut shoulder (or step) portion 222 formed at the end thereof facing in the Z1 direction.

Moreover, in the present embodiment, the first resin part 12 of the first welded member 1 has an end portion thereof in the X direction arranged to face a surface of the cut shoulder portion 222 of the second resin part 22 which faces in the Z1 direction.

According to the present embodiment, it is also possible to achieve the same operational effects as described in the first embodiment.

Moreover, according to the present embodiment, with the end portion of the first resin part 12 arranged to face the surface of the cut shoulder portion 222 which faces in the Z1 direction, it becomes possible to more effectively block the welding spatter from scattering to the opposite side of the first and second resin parts 12 and 22 to the weld 3 during the welding.

Fourth Embodiment

An electrical apparatus 10 according to the fourth embodiment has a similar configuration to the electrical apparatuses 10 according to the previous embodiments. Therefore, mainly the differences therebetween will be described hereinafter.

In the electrical apparatuses 10 according to the previous embodiments, in each pair of the first and second welded members 1 and 2, at least one of the first resin part 12 of the first welded member 1 and the second resin part 22 of the second welded member 2 has a brim portion formed therein (see FIGS. 1, 11 and 12).

Figure 13:
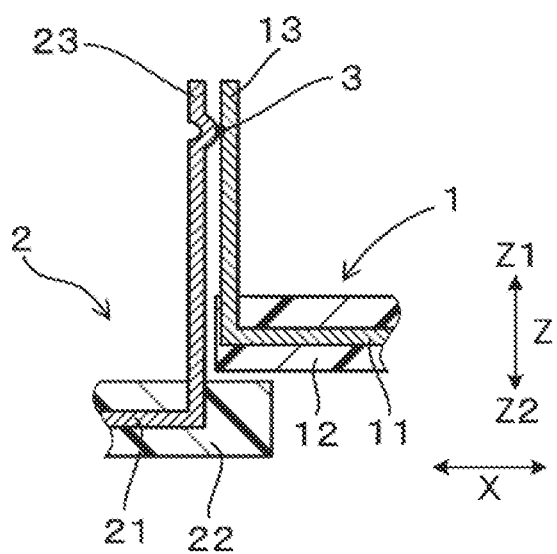
FIG. 13 is a cross-sectional view of part of an electrical apparatus according to a fourth embodiment.

In contrast, in the electrical apparatus 10 according to the fourth embodiment, as shown in FIG. 13, in each pair of the first and second welded members 1 and 2, neither the first resin part 12 of the first welded member 1 nor the second resin part 22 of the second welded member 2 has a brim portion formed therein.

Moreover, in the present embodiment, the first metal part 11 of the first welded member 1 is bent in the first resin part 12. Similarly, the second metal part 21 of the second welded member 2 is bent in the second resin part 22. In addition, each of the first resin part 12 of the first welded member 1 and the second resin part 22 of the second welded member 2 has a relatively large dimension in the X direction perpendicular to the Z direction.

According to the present embodiment, it is also possible to achieve the same operational effects as described in the first embodiment.

While the above particular embodiments have been shown and described, it will be understood by those skilled in the art that various modifications, changes and improvements may be made without departing from the spirit of the present disclosure.

What is claimed is:

1. An electrical apparatus comprising a first welded member and a second welded member that are welded together,
    the first welded member having a first metal part and a first resin part that covers part of the first metal part,
    the second welded member having a second metal part and a second resin part that covers part of the second metal part,
    the first metal part having a first standing terminal portion exposed from the first resin part and standing in a standing direction,
    the second metal part having a second standing terminal portion exposed from the second resin part and standing in the same standing direction as the first standing terminal portion,
    the first standing terminal portion and the second standing terminal portion being welded to each other so that a weld is formed therebetween,
    the first resin part and the second resin part partially overlapping each other in the standing direction, and
    the weld being within a projection region of the first resin part and the second resin part in the standing direction.

2. The electrical apparatus as set forth in claim 1, wherein at least one of the first resin part and the second resin part has a brim portion projecting perpendicularly to the standing direction.

3. The electrical apparatus as set forth in claim 2, wherein the brim portion is formed so that when viewed in the standing direction, it projects to at least three sides including an opposite side to an adjoining side in an adjoining direction and both sides in a direction perpendicular to the adjoining direction, the adjoining side being a side where the first resin part and the second resin part adjoin each other, the adjoining direction being a direction in which the first resin part and the second resin part adjoin each other.

4. The electrical apparatus as set forth in claim 1, further comprising an electronic circuit unit that is arranged on an opposite side to the weld with at least one of the first resin part and the second resin part interposed therebetween.

5. A method of manufacturing an electrical apparatus,
    the electrical apparatus comprising a first welded member and a second welded member that are welded together, the first welded member having a first metal part and a first resin part that covers part of the first metal part, the second welded member having a second metal part and a second resin part that covers part of the second metal part, the first metal part having a first standing terminal portion exposed from the first resin part and standing in a standing direction, the second metal part having a second standing terminal portion exposed from the second resin part and standing in the same standing direction as the first standing terminal portion,
    the method comprising the steps of:
    arranging the first welded member and the second welded member so as to have (i) the first resin part and the second resin part partially overlapping each other in the standing direction and (ii) both a welded portion of the first standing terminal portion and a welded portion of the second standing terminal portion located within a projection region of the first resin part and the second resin part in the standing direction;
    placing a surrounding jig around the first standing terminal portion and the second standing terminal portion so as to surround at least the welded portions of the first and second standing terminal portions from directions perpendicular to the standing direction; and
    welding the welded portions of the first and second standing terminal portions, which are surrounded by the surrounding jig, to each other to form a weld therebetween.

6. The method as set forth in claim 5, wherein
    at least one of the first resin part and the second resin part has a brim portion projecting perpendicularly to the standing direction, and
    in the placing step, the surrounding jig is placed so as to have at least part of an opening edge thereof facing the brim portion in the standing direction.

7. The method as set forth in claim 6, wherein
    the brim portion is formed so that when viewed in the standing direction, it projects to at least three sides including an opposite side to an adjoining side in an adjoining direction and both sides in a direction perpendicular to the adjoining direction, the adjoining side being a side where the first resin part and the second resin part adjoin each other, the adjoining direction being a direction in which the first resin part and the second resin part adjoin each other.

8. The method as set forth in claim 5, wherein
    the electrical apparatus further comprises an electronic circuit unit that is arranged on an opposite side to the weld with at least one of the first resin part and the second resin part interposed therebetween.

* * * * *